US012776352B2

(12) United States Patent
Kwak et al.

(10) Patent No.: US 12,776,352 B2
(45) Date of Patent: Oct. 27, 2026

(54) STORAGE DEVICE BASED ON DAISY CHAIN TOPOLOGY

(71) Applicant: SK hynix Inc., Gyeonggi-do (KR)

(72) Inventors: Jeffrey E. Kwak, Gyeonggi-do (KR); Jae Hoon Ko, Gyeonggi-do (KR); Jong Joo Lee, Gyeonggi-do (KR); Kyung Woo Kim, Gyeonggi-do (KR); Hee Ju Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 128 days.

(21) Appl. No.: 18/797,533

(22) Filed: Aug. 8, 2024

(65) Prior Publication Data

US 2024/0395292 A1 Nov. 28, 2024

Related U.S. Application Data

(63) Continuation of application No. 17/587,056, filed on Jan. 28, 2022, now Pat. No. 12,087,390.

(30) Foreign Application Priority Data

Sep. 29, 2021 (KR) ........................ 10-2021-0128800

(51) Int. Cl.
*G11C 7/10* (2006.01)
*G11C 8/18* (2006.01)

(52) U.S. Cl.
CPC ............ *G11C 7/1063* (2013.01); *G11C 7/106* (2013.01); *G11C 7/1087* (2013.01); *G11C 7/109* (2013.01); *G11C 8/18* (2013.01)

(58) Field of Classification Search
CPC .................................................... G11C 7/1063
USPC .......................................................... 365/193
See application file for complete search history.

(56) References Cited

U.S. PATENT DOCUMENTS

| | | | | |
|---|---|---|---|---|
| 7,778,057 B2 * | 8/2010 | McCarthy | G11C 29/48 365/185.11 |
| 9,741,435 B1 * | 8/2017 | Choy | G11C 11/1673 |
| 2002/0188781 A1 * | 12/2002 | Schoch | G06F 13/37 710/107 |
| 2004/0037133 A1 * | 2/2004 | Park | G06F 13/4234 365/202 |
| 2009/0043932 A1 * | 2/2009 | Bernardi | G11C 5/04 710/110 |

(Continued)

FOREIGN PATENT DOCUMENTS

| | | |
|---|---|---|
| CN | 108417233 A | 8/2018 |
| KR | 10-0736676 B1 | 7/2007 |

(Continued)

OTHER PUBLICATIONS

Office Action for Chinese Patent Application No. 202210712767.1 issued by the Chinese Patent Office on Jul. 24, 2025.

*Primary Examiner* — Muna A Techane
(74) *Attorney, Agent, or Firm* — IP&T GROUP LLP

(57) ABSTRACT

Embodiments of the present disclosure relate to a storage device based on a daisy chain topology. According to embodiments of the present disclosure, a storage device may include a plurality of memory package chips each including a plurality of memory dies capable of storing data; and a controller communicating with the plurality of memory package chips and connected to the plurality of memory package chips through one or more daisy chain circuits.

13 Claims, 12 Drawing Sheets

(56) References Cited

U.S. PATENT DOCUMENTS

| | | | | |
|---|---|---|---|---|
| 2012/0233433 | A1* | 9/2012 | Grunzke | G06F 12/0813 711/170 |
| 2015/0382296 | A1* | 12/2015 | Wentzloff | H03K 3/0231 375/130 |
| 2021/0175806 | A1* | 6/2021 | Aulagnier | H02M 3/1584 |

FOREIGN PATENT DOCUMENTS

| | | | |
|---|---|---|---|
| KR | 10-2017-0031720 | A | 3/2017 |
| WO | 2016/039916 | A1 | 3/2016 |

* cited by examiner

STORAGE DEVICE BASED ON DAISY CHAIN TOPOLOGY

CROSS-REFERENCE TO RELATED APPLICATION

This application is a continuation of U.S. patent application Ser. No. 17/587,056 filed on Jan. 28, 2022, which claims priority under 35 U.S.C. 119 (a) to Korean patent application number 10-2021-0128800 filed on Sep. 29, 2021, which is incorporated herein by reference in its entirety.

TECHNICAL FIELD

The embodiments of the present disclosure relate to a storage device based on a daisy chain topology.

BACKGROUND

A storage device may store data on the basis of a request from a host, such as a computer, servers, a smartphone, a tablet PC, or other electronic devices. The storage device may include devices for storing data on magnetic disks such as hard disk drives (HDDs), and devices for storing data in a non-volatile memory, such as a solid state drive (SSD), a universal flash storage (UFS) device, an embedded MMC (eMMC) device.

The performance requirements of the customer for storage capacity and speed of storage devices are increasing. Therefore, in order to satisfy the performance requirements of the customer, it is required to configure a topology of the components included in the storage device to operate at a high speed while providing a high storage capacity.

SUMMARY

Embodiments of the present disclosure may provide a storage device capable of operating at high speed while having a high storage capacity.

In one aspect, embodiments of the present disclosure may provide a storage device including a plurality of memory package chips each including a plurality of memory dies capable of storing data, and a controller which communicates with the plurality of memory package chips and connected to the plurality of memory package chips through one or more daisy chain circuits.

Each of the plurality of memory package chips may be connected to the plurality of memory dies included in each of the memory package chips. The storage device may further include an interface chip connected to the plurality of memory dies and provides an interface for the controller to access the plurality of memory dies.

According to embodiments of the present disclosure, it is possible to provide a storage device capable of operating at a high speed while having a high storage capacity.

DETAILED DESCRIPTION

Figure 1:
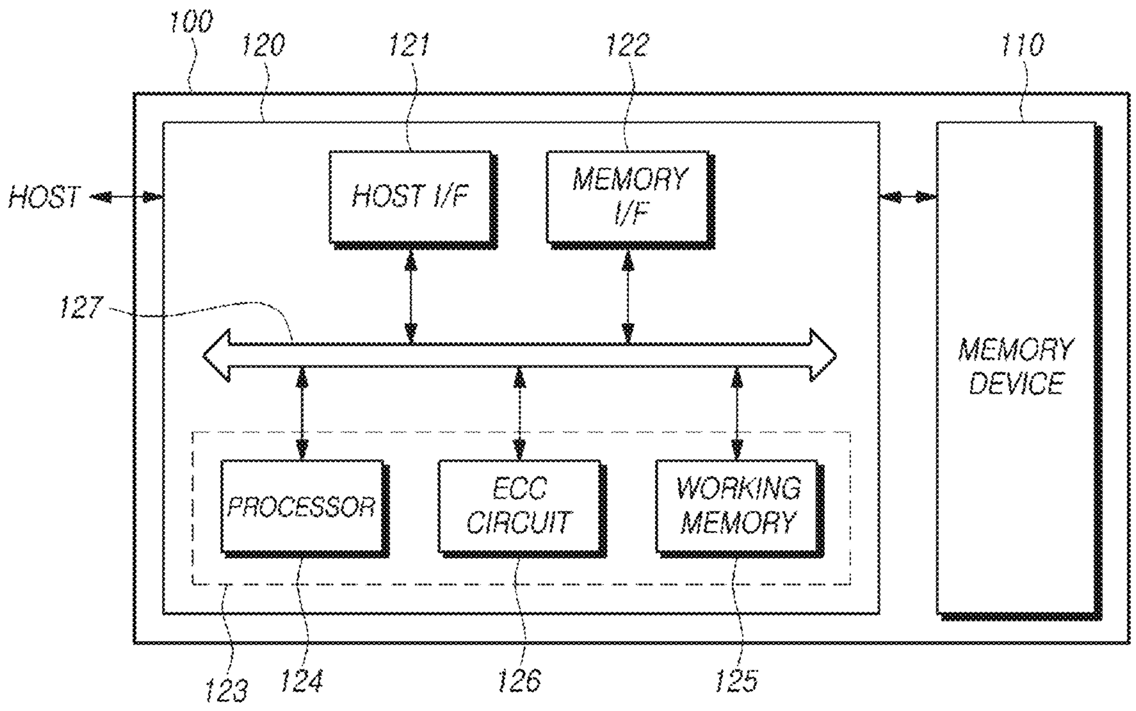
FIG. 1 is a schematic diagram illustrating a configuration of a memory system based on an embodiment of the disclosed technology.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 is a diagram illustrating the schematic configuration of a memory system 100 based on an embodiment of the disclosed technology.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the disclosed technology are applicable to any type of flash memory devices having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120, to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erasure operation, and the like. During the program operation, the memory device 110 may write data in the area selected by the address. During the read operation, the memory device 110 may read data from a memory area selected by the address. During the erasure operation, the memory device 110 may erase data stored in a memory area selected by the address.

The memory controller 120 may control write (program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs such background operations of the memory device.

The memory controller 120 and the host may be separate devices. In some implementations, the memory controller 120 and the host may be integrated and implemented as a single device. In the following description, the memory controller 120 and the host will be discussed as separate devices as an example.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table. There are various address mapping methods which may be employed by the FTL, based on the mapping unit. Typical address mapping methods may include a page mapping method, a block mapping method, and a hybrid mapping method.

The processor 124 may be configured to randomize data received from the host to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. In other words, the processor 124 may control the overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one of a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In the present disclosure, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked “fail.” If the BER is lower than or equals to the reference value, the error detection/correction circuit 126 may determine that the corresponding sector is correctable or the corresponding sector can be marked “pass.”

The error detection/correction circuit 126 may perform error detection and correction operations successively on all read data. When a sector included in the read data is correctable, the error detection/correction circuit 126 may move on to the next sector to check whether an error correction operation is needed on the next sector. Upon completion of the error detection and correction operations on all of the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of those illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
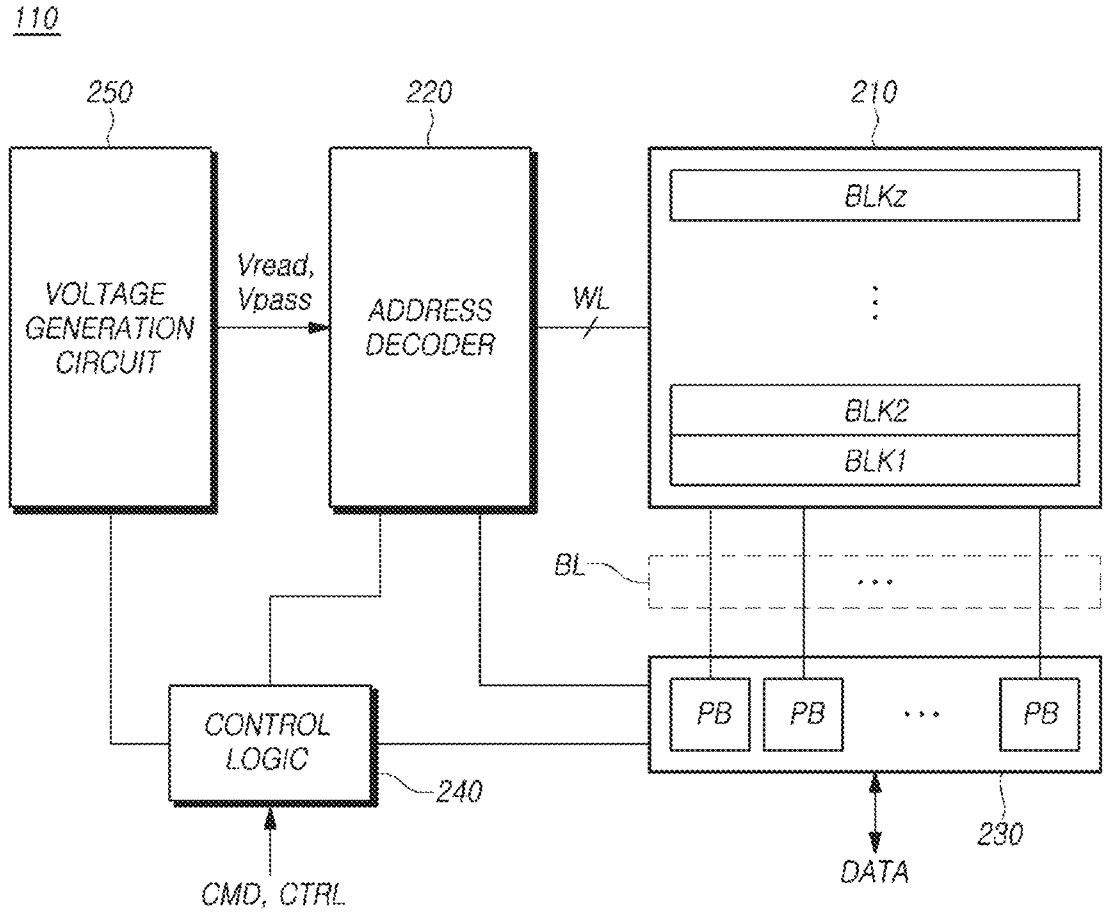
FIG. 2 is a block diagram schematically illustrating a memory device based on an embodiment of the disclosed technology.

FIG. 2 is a block diagram schematically illustrating a memory device 110 based on an embodiment of the disclosed technology.

In some implementations, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be disposed in rows and columns, and multiple memory cells MC may be arranged in a memory block.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erasure operation may be performed memory block by memory block.

Figure 3:
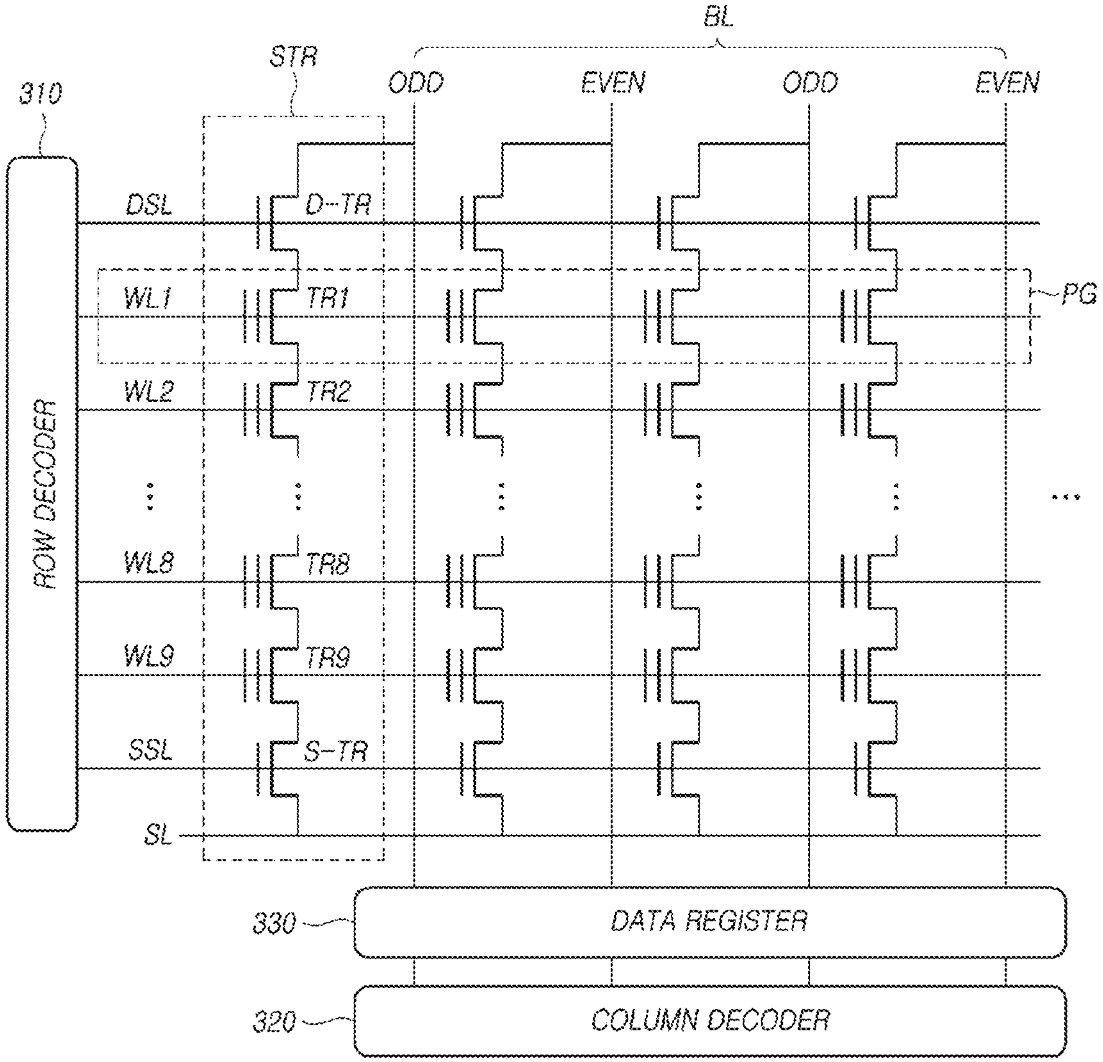
FIG. 3 illustrates a structure of word lines and bit lines of a memory device based on an embodiment of the disclosed technology.

FIG. 3 is a diagram illustrating a structure of word lines WL and bit lines BL of a memory device 110 based on an embodiment of the disclosed technology.

Referring to FIG. 3, the memory device 110 has a core area in which memory cells MC are arranged, and an auxiliary area (the remaining area other than the core area) which includes circuitry that is used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of an odd-numbered bit line and an even-numbered bit line is coupled in common to a column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gates FG of the selected memory cells.

Figure 4:
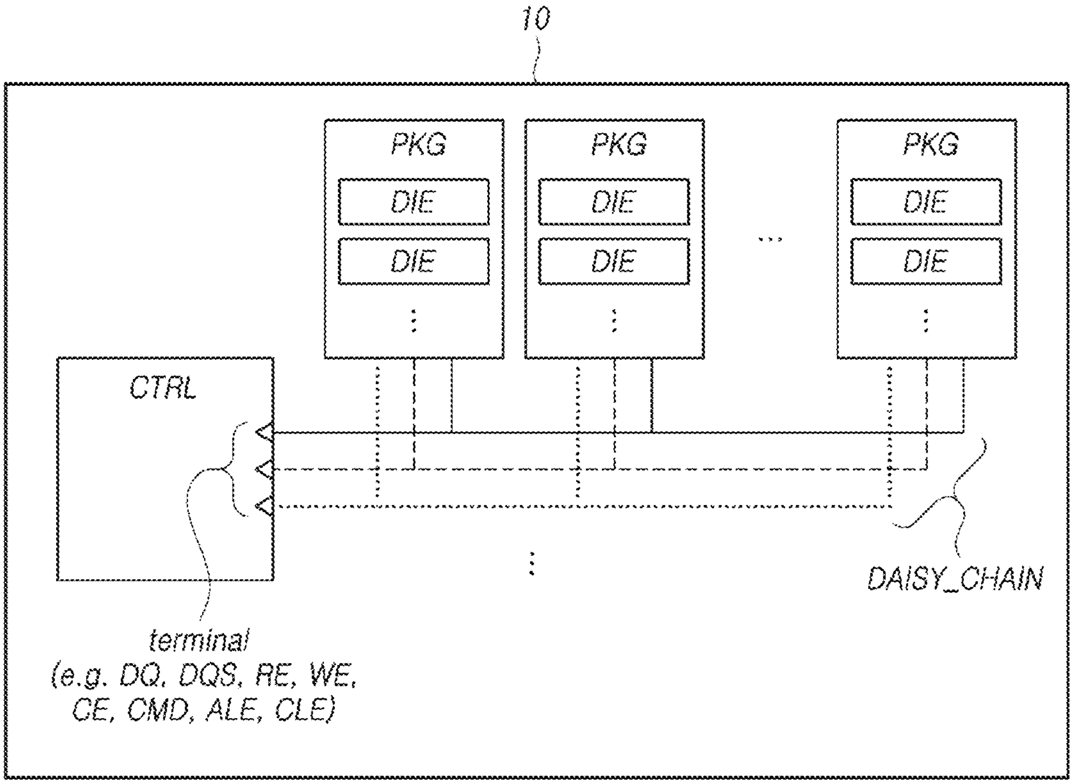
FIG. 4 illustrates a schematic structure of a storage device according to embodiments of the present disclosure.

FIG. 4 illustrates a schematic structure of a storage device 10 according to embodiments of the present disclosure.

Referring to FIG. 4, the storage device 10 may include a plurality of memory package chips PKG and a controller CTRL.

Each of the plurality of memory package chips PKG may store data. Each of the plurality of memory package chips PKG may include a plurality of memory dies DIE to store data.

The controller CTRL may communicate with the plurality of memory package chips PKG to access the plurality of memory package chips PKG. The controller CTRL may be electrically connected to the plurality of memory package chips PKG through conductive lines in order to transmit or receive a signal for communicating with the plurality of memory package chips PKG to and from the plurality of memory package chips PKG. In this case, a portion of the conductive line connected between the controller CTRL and the plurality of memory package chips PKG may be referred to as a trace.

That is, the controller CTRL may access the memory die through the plurality of memory package chips PKG including a group of memory dies required to store data, and may process a request from the host.

Hereinafter, a reason why the controller CTRL accesses the memory dies through the plurality of memory package chips PKG instead of directly accessing the memory dies to store data, will be described.

In order for the storage device 10 to secure a level of storage capacity that satisfies the performance requirements of the customer, many memory dies may be required. In this case, if many memory dies are all directly connected to the controller CTRL, there may occur issues that 1) the CIO (Capacitance I/O) increases due to the memory dies connected to the controller CTRL, and 2) each memory die acts as a stub to the other memory die.

In this case, there may be likely to occur an issue in which a signal transmitted and received between the controller CTRL and memory dies connected to the controller CTRL deteriorates in term of signal integrity (SI).

Accordingly, in order to prevent such degradation of signal integrity, the controller CTRL may access the memory dies through the plurality of memory package chips PKG.

In the case that the controller CTRL is connected to the plurality of memory package chips PKG, there may be a change the performance of the storage device 10 depending on which topology the controller CTRL and the plurality of memory package chips PKG which are connected, is based on.

The controller CTRL and the plurality of memory package chips PKG may be connected based on various topologies (e.g., T-Topology, Daisy Chain).

In embodiments of the present disclosure, the controller CTRL may be connected to a plurality of memory package chips PKG through one or more daisy chain circuits DAISY_CHAIN.

Each of the daisy chain circuits DAISY_CHAIN is a circuit that consecutively connects the controller CTRL and the plurality of memory package chips PKG based on a daisy chain topology. Each daisy chain circuit DAISY_CHAIN may include a conductive line for connecting the controller CTRL and the plurality of memory package chips PKG. In this case, the traces which are portion of the conductive line included in each daisy chain circuit DAISY_CHAIN may constitute a daisy chain topology.

In addition, each daisy chain circuit DAISY_CHAIN may be connected to a different terminal of the controller CTRL.

In this case, one of the terminals of the controller CTRL may be connected to one of daisy chain circuits DAISY_CHAIN, and even terminals of the same type may be connected to different daisy chain circuits DAISY_CHAIN.

The types of terminals of the controller CTRL may be a data signal terminal DQ, a data strobe signal terminal DQS, a read enable signal terminal RE, a command signal terminal CMDS, a chip enable signal terminal CE, an address latch enable signal terminal ALE, a command latch enable signal terminal CLE, and the like.

For example, two data strobe signal terminals DQS included in the controller CTRL may be respectively connected to different daisy chain circuits DAISY_CHAIN.

As another example, the N chip enable signal terminals CE included in the controller CTRL (N is a natural number greater than or equal to 2) may be respectively connected to different daisy chain circuits DAISY_CHAIN.

In embodiments of the present disclosure, the controller CTRL and the plurality of memory package chips PKG are connected in a daisy chain topology using daisy chain circuits DAISY_CHAIN. Accordingly, it is possible to distribute the capacitance I/O (CIO) by the plurality of memory package chips PKG, thereby preventing a decrease in the slew rate.

Moreover, for each of the daisy chain circuits DAISY_CHAIN, the length of the conductive line connected to each of the controller CTRL and the plurality of memory package chips PKG is different for each of the plurality of memory package chips PKG. For example, the length of the conductive line between the controller CTRL and the adjacent memory package chip is shorter than the length of the conductive line between the controller CTRL and the distant memory package chip. Accordingly, the signal integrity characteristics of each of the plurality of memory package chips PKG are also different from each other.

Furthermore, when the controller CTRL and the plurality of memory package chips PKG are connected by daisy chain circuits DAISY_CHAIN, the length of the conductive line connected to each of the controller CTRL and the plurality of memory package chips PKG may be optimized to minimize a difference in signal integrity characteristics for each of the plurality of memory package chips PKG.

In particular, the lengths of conductive lines connected to the controller CTRL and each of the plurality of memory package chips PKG may be set so that a ringback caused by reflection generated by a conductive line connected to each of the plurality of memory package chips PKG may occur at a point where the signal is crossed.

The storage device 10 may be implemented in various ways. As an example, the storage device 10 may be implemented as a memory system 100 described with reference to FIG. 1. In this case, the controller CTRL may be implemented as a memory controller 120, and each of the plurality of memory package chips PKG may be implemented as a part of a memory device 110.

As another example, the controller CTRL may be implemented as a system-on-chip (SoC) including a microprocessor, a memory, and a semiconductor component, and each of the plurality of memory package chips PKG may be a memory chip including volatile memories or non-volatile memories.

Figure 5:
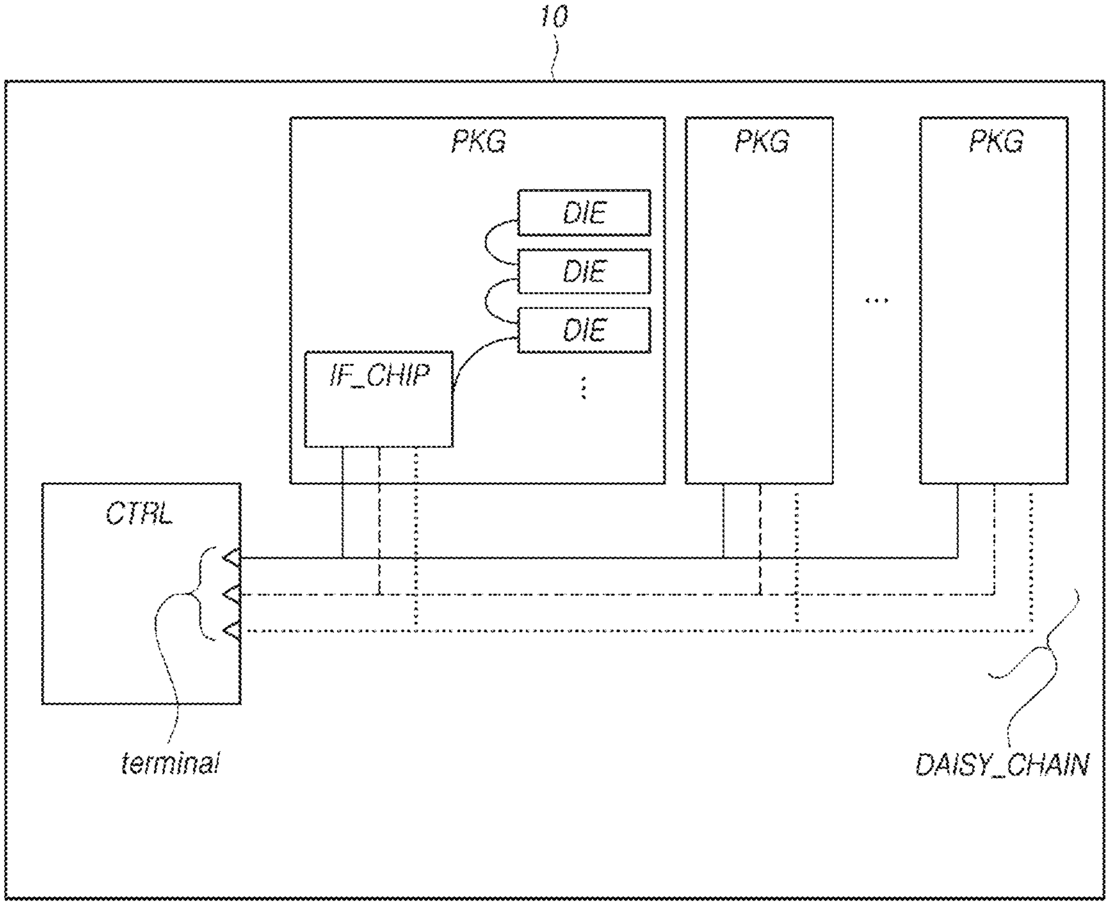
FIG. 5 illustrates a schematic structure of a memory package chip according to embodiments of the present disclosure.

FIG. 5 illustrates a schematic structure of a memory package chip PKG according to embodiments of the present disclosure.

Referring to FIG. 5, a memory package chip PKG may further include an interface chip IF_CHIP together with a plurality of memory dies DIE.

The interface chip IF_CHIP may provide an interface for the controller CTRL to access the plurality of memory dies DIE. The interface chip IF_CHIP may output a signal input from the controller CTRL to the plurality of memory dies DIE or may output a signal input from the plurality of memory dies to the controller CTRL. In this case, the interface chip IF_CHIP may convert and output an input signal for compatibility between the controller CTRL and the plurality of memory dies DIE.

One or more daisy chains DAISY_CHAIN included in the storage device 10 may be connected to the interface chip IF_CHIP included in the memory package chip PKG.

In order to access the plurality of memory dies DIE included in a specific memory package chip PKG, the controller CTRL is required to go through the interface chip IF_CHIP included in the corresponding memory package chip.

As such, the controller CTRL accesses the plurality of memory dies DIE via the interface chip IF_CHIP, thereby preventing the deterioration in terms of signal integrity, the deterioration being caused due to the direct connection between the controller CTRL and the plurality of memory dies DIE. In addition, the controller CTRL may stably access the plurality of memory dies DIE included in each of the plurality of memory package chips PKG.

Figure 6:
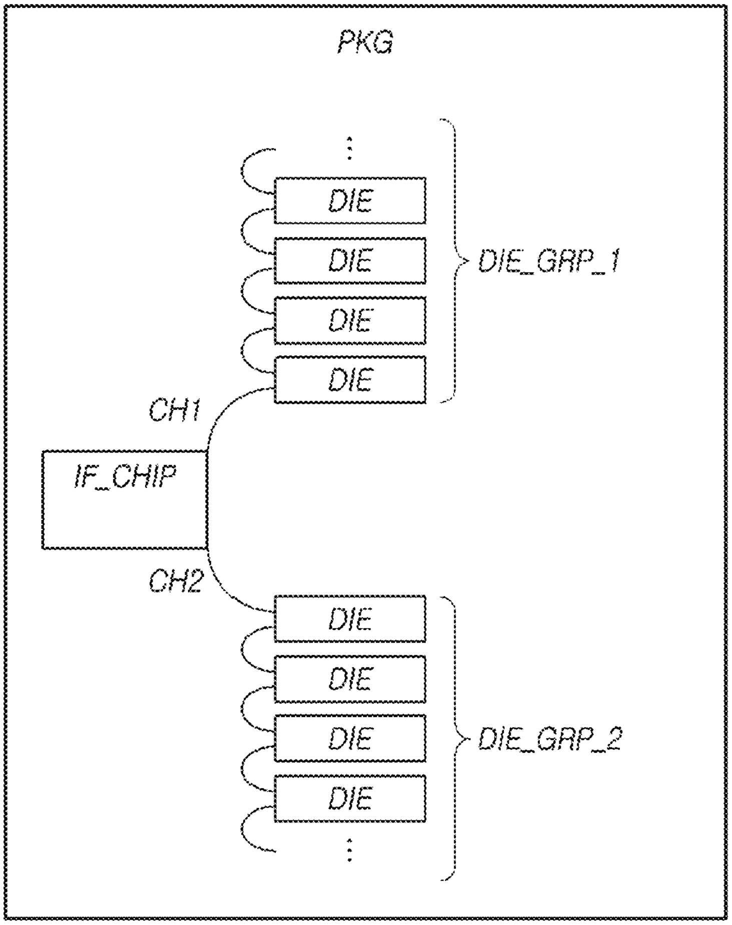
FIG. 6 illustrates an example of a connection relationship between an interface chip and a plurality of memory dies according to embodiments of the present disclosure.

FIG. 6 illustrates an example of a connection relationship between an interface chip IF_CHIP and a plurality of memory dies DIE according to embodiments of the present disclosure.

Referring to FIG. 6, the memory dies included in a first memory die group DIE_GRP_1 among the plurality of memory dies DIE may be connected to the interface chip IF_CHIP through a first channel CH1. In addition, the memory dies included in a second memory die group DIE_GRP_2 among the plurality of memory dies DIE may be connected to the interface chip IF_CHIP through a second channel CH2.

Memory dies belonging to the same memory group and the interface chip IF_CHIP may be connected to each other based on a daisy chain topology.

In FIG. 6, the memory dies included in the first memory die group DIE_GRP_1 and the interface chip IF_CHIP may be connected to each other based on a daisy chain topology. In addition, the memory dies included in the second memory die group DIE_GRP_1 and the interface chip IF_CHIP may be connected to each other based on a daisy chain topology.

Figure 7:
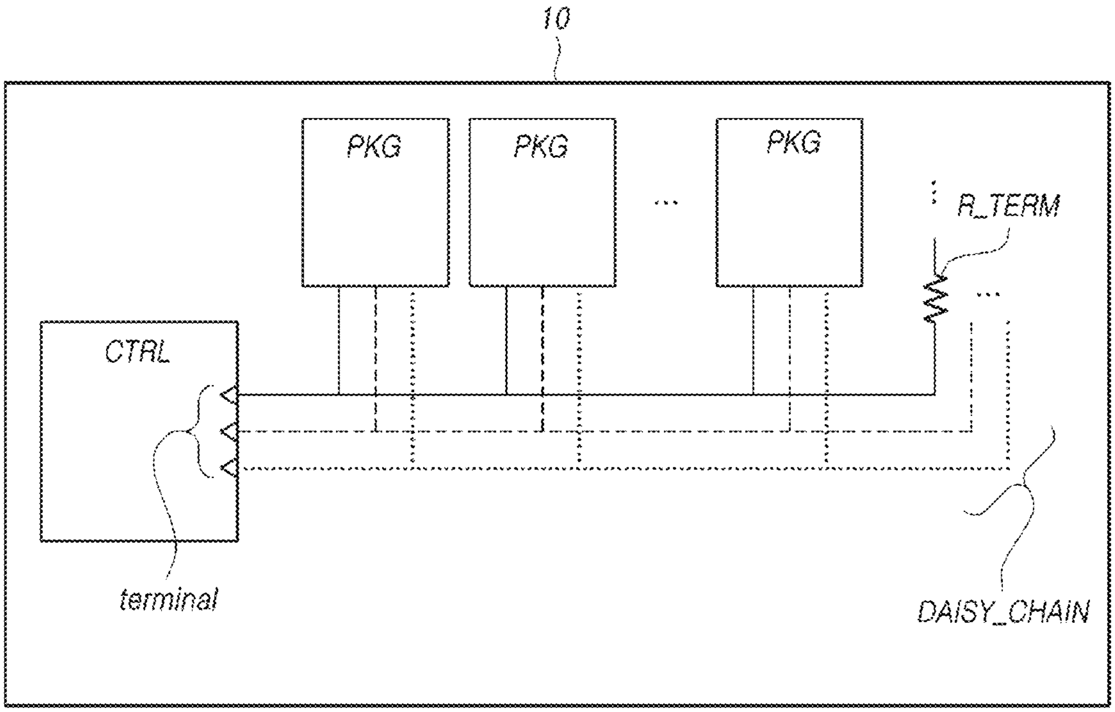
FIG. 7 illustrates an example of a storage device including a termination resistor according to embodiments of the present disclosure.

FIG. 7 illustrates an example of a storage device 10 including a termination resistor R_TERM according to embodiments of the present disclosure.

Referring to FIG. 7, the storage device 10 may include a termination resistor R_TERM connected to one or more of the daisy chain circuits DAISY_CHAIN.

A reason for connecting the termination resistor R_TERM to one or more of the daisy chain circuits DAISY_CHAIN is to reduce reflection of a signal due to a conductive line connected between the controller CTRL and the plurality of memory package chips PKG.

In the case that the controller CTRL and the plurality of memory package chips PKG are connected through a daisy chain topology, for a specific memory package chip adjacent to the controller CTRL, there may occur a reflection since other memory package chips and conductive lines connecting to the back of the memory package chip act as stubs.

Accordingly, in the storage device 10, for conductive line acting as a stub to one or more of the daisy chain circuits DAISY_CHAIN, there may be connected a termination resistor R_TERM which matches the impedance of the corresponding conductive line so as to minimize the reflection.

The termination resistor R_TERM may be located farthest from the controller CTRL on the connected daisy chain circuit DAISY_CHAIN. That is, for all of the plurality of memory package chips PKG, the termination resistor R_TERM is not located on the conductive line connected between each memory package chip PKG and the controller CTRL.

This is so that, for all of the plurality of memory package chips PKG, the conductive line located farthest from the controller CTRL is terminated by the termination resistor R_TERM.

Further, the termination resistor R_TERM may be connected to one or more of the daisy chain circuits DAISY_CHAIN in various ways. In this case, the method for connecting the termination resistor R_TERM to one or more of the daisy chain circuits DAISY_CHAIN may be determined depending on which terminal of the controller CTRL is connected to the daisy chain circuit connected to the termination resistor R_TERM.

Figure 8:
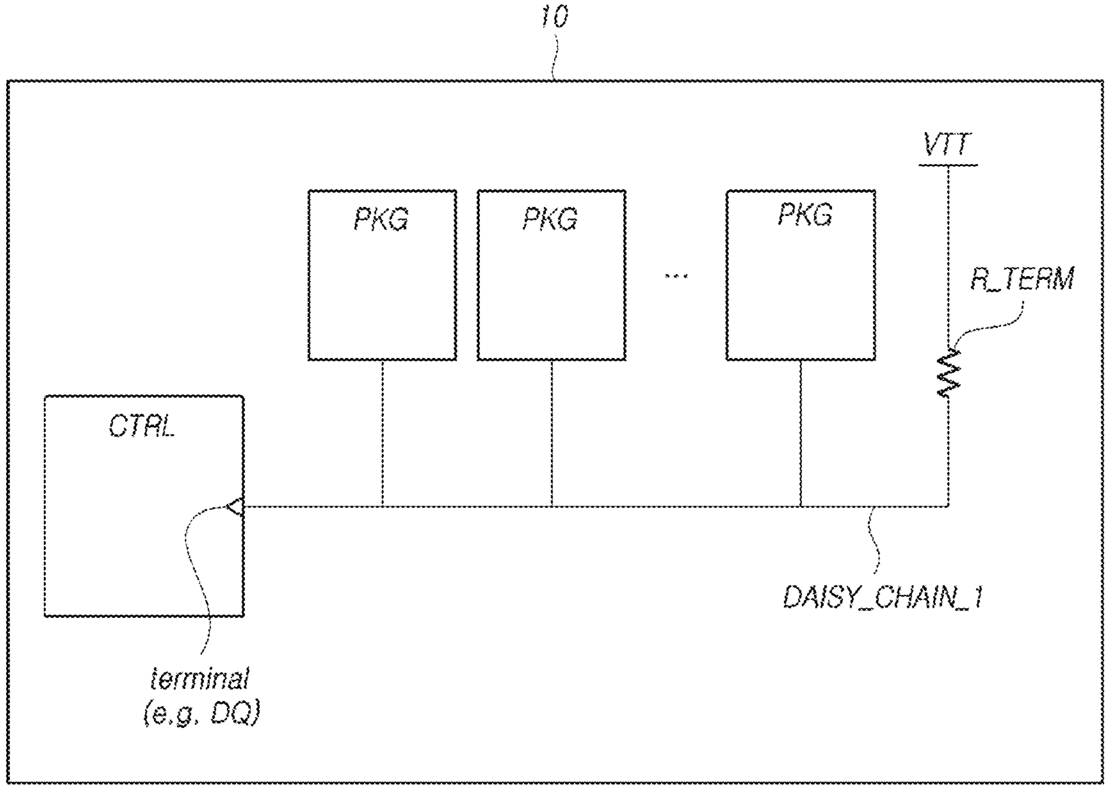
FIG. 8 illustrates an example of a connection method of a termination resistor according to embodiments of the present disclosure.

FIG. 8 illustrates an example of a connection method of a termination resistor R_TERM according to embodiments of the present disclosure.

Referring to FIG. 8, the termination resistor R_TERM may be connected between a first daisy chain circuit DAISY_CHAIN_1 among the daisy chain circuits DAISY_CHAIN and a termination voltage input terminal VTT. The termination voltage input terminal is a path through which a termination voltage is input.

In FIG. 8, the first daisy chain circuit DAISY_CHAIN_1 may be connected, for example, to a data input/output signal terminal DQ of the controller CTRL.

Figure 9:
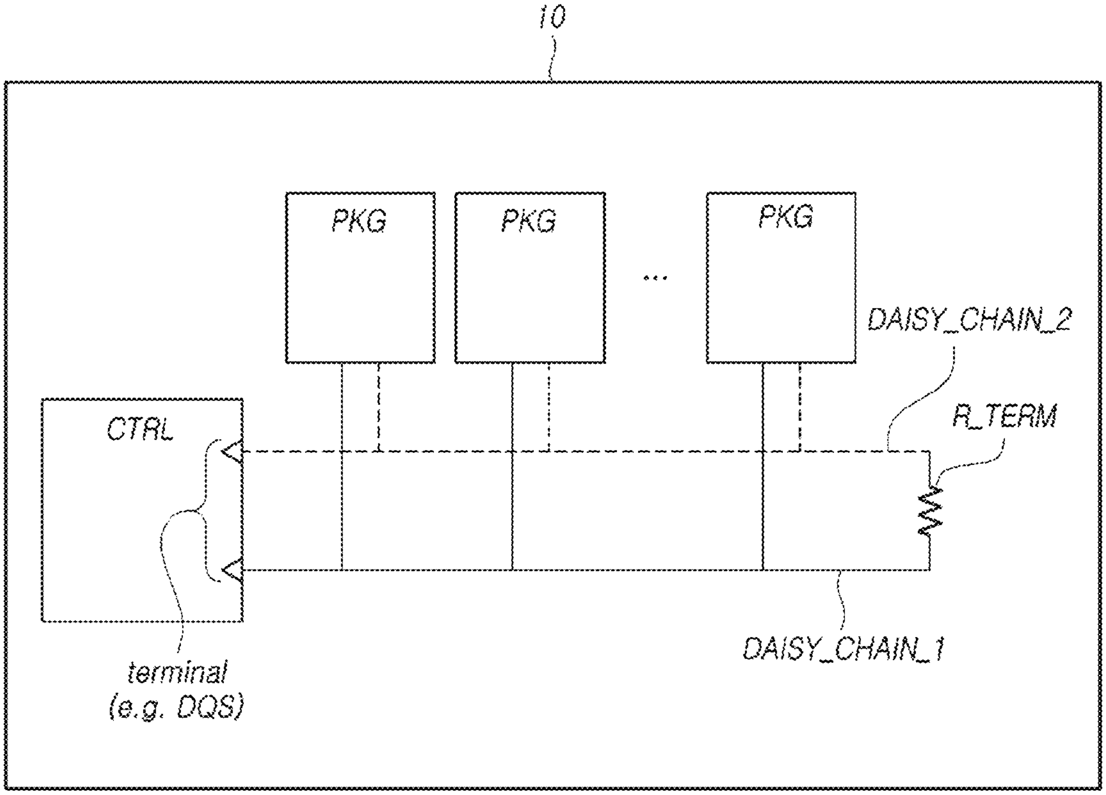
FIG. 9 illustrates another example of a connection method of a termination resistor according to embodiments of the present disclosure.

FIG. 9 illustrates another example of a connection method of a termination resistor R_TERM according to embodiments of the present disclosure.

Referring to FIG. 9, the termination resistor R_TERM may be connected between the first daisy chain circuit DAISY_CHAIN_1 and a second daisy chain circuit DAISY_CHAIN_2 among the daisy chain circuits DAISY_CHAIN. This may be used when differential signals are transmitted through the first daisy chain circuit DAISY_CHAIN_1 and the second daisy chain circuit DAISY_CHAIN_2.

In FIG. 9, the first daisy chain circuit DAISY_CHAIN_2 and the second daisy chain circuit DAISY_CHAIN_2 may be connected, for example, respectively to two data strobe signal terminals DQS of the controller CTRL.

Figure 10:
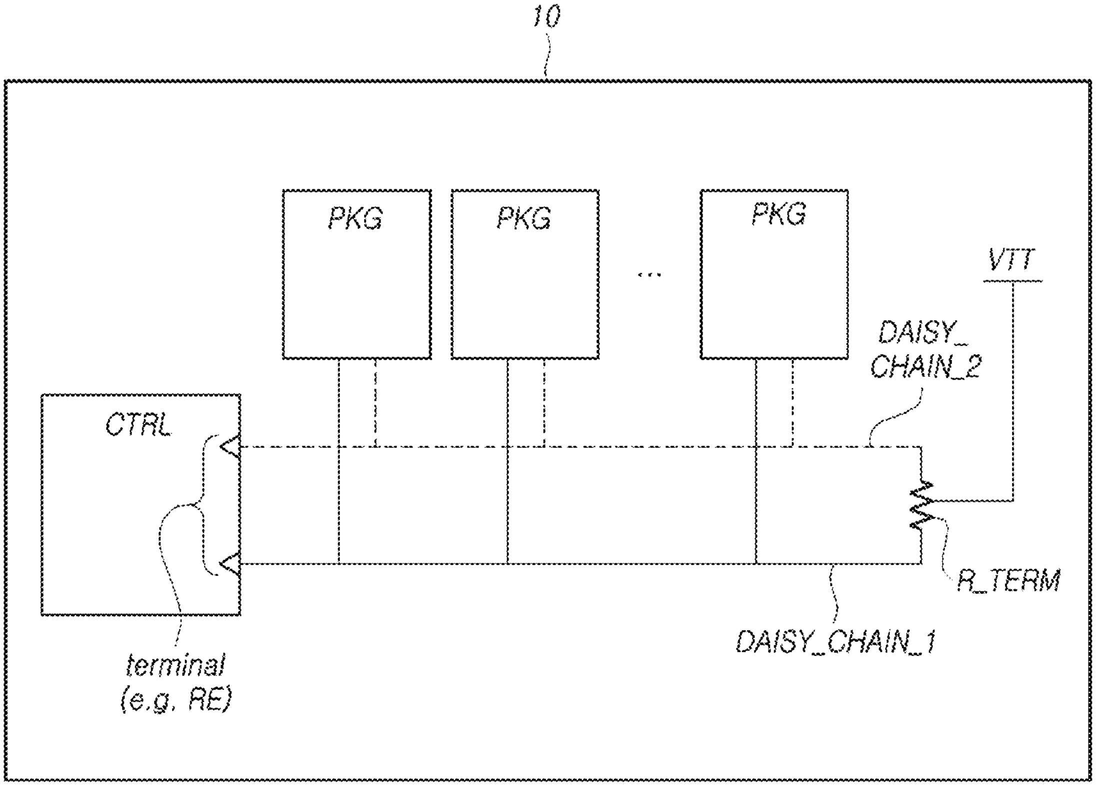
FIG. 10 illustrates another example of a connection method of a termination resistor according to embodiments of the present disclosure.

FIG. 10 illustrates another example of a connection method of a termination resistor R_TERM according to embodiments of the present disclosure.

Referring to FIG. 10, a termination resistor R_TERM may be connected to a first daisy chain circuit DAISY_CHAIN_1, a second daisy chain circuit DAISY_CHAIN_2 among the daisy chain circuits DAISY_CHAIN, and a termination voltage input terminal VTT.

In FIG. 10, the first daisy chain circuit DAISY_CHAIN_1 and the second daisy chain circuit DAISY_CHAIN_2 may be connected, for example, respectively to two read enable signal terminals RE of the controller CTRL.

Since only one of the two read enable signal terminals RE operates when the storage device 10 is booted, one of the first daisy chain circuit DAISY_CHAIN_1 and the second daisy chain circuit DAISY_CHAIN_2 may be connected to the termination resistor R_TERM.

On the other hand, since the two read enable signal terminals RE operate after the storage device 10 is booted, the first daisy chain circuit DAISY_CHAIN_2 and the second daisy chain circuit DAISY_CHAIN_2 may be connected through the termination resistor R_TERM.

Figure 11:
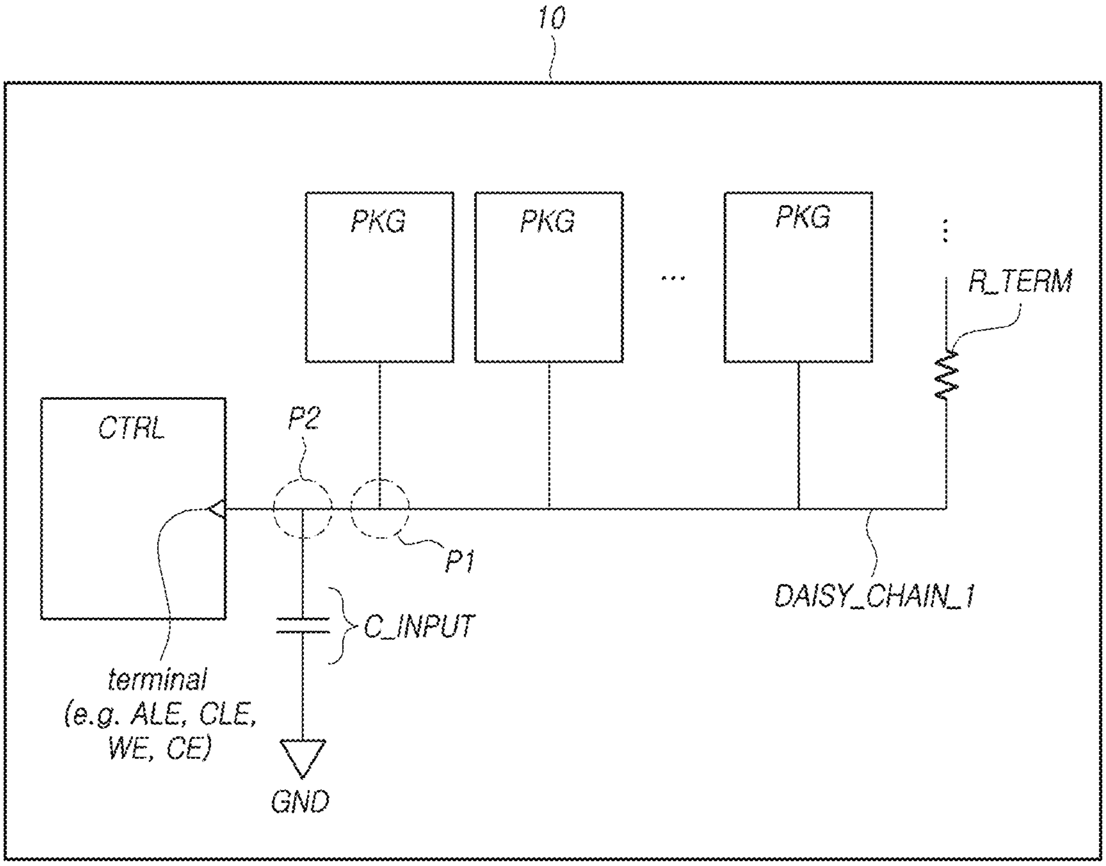
FIG. 11 illustrates an example of a storage device including an input capacitor according to embodiments of the present disclosure.

FIG. 11 illustrates an example of a storage device including an input capacitor C_INPUT according to embodiments of the present disclosure.

Referring to FIG. 11, the storage device 10 may further include an input capacitor C_INPUT. The input capacitor C_INPUT may be connected to the controller CTRL, a first daisy chain circuit DAISY_CHAIN_1 among daisy chain circuits DAISY_CHAIN, and a ground GND.

For example, the input capacitor C_INPUT may be connected between 1) a point P2 between the controller CTRL and a point P1 where a conductive line branches from the first daisy chain circuit DAISY_CHAIN_1 to a memory package chip closest to the controller CTRL, and 2) a ground GND.

In order to reduce a ringback which occurs when a signal operating at low speed (e.g., a signal input/output to the command signal terminal CMDS) operates with a fast rise time similar to a signal operating at high speed (e.g., a signal input/output to the data input/output signal terminal DQ), the storage device may use the input capacitor C_INPUT. If the input capacitor C_INPUT is added, the rise time becomes slow, so that the ringback may decrease.

In FIG. 11, the first daisy chain circuit DAISY_CHAIN_1 may be connected, for example, to an address latch enable signal terminal ALE, a command latch enable signal terminal CLE, and a write enable signal terminal WE, or a chip enable signal terminal CE.

Figure 12:
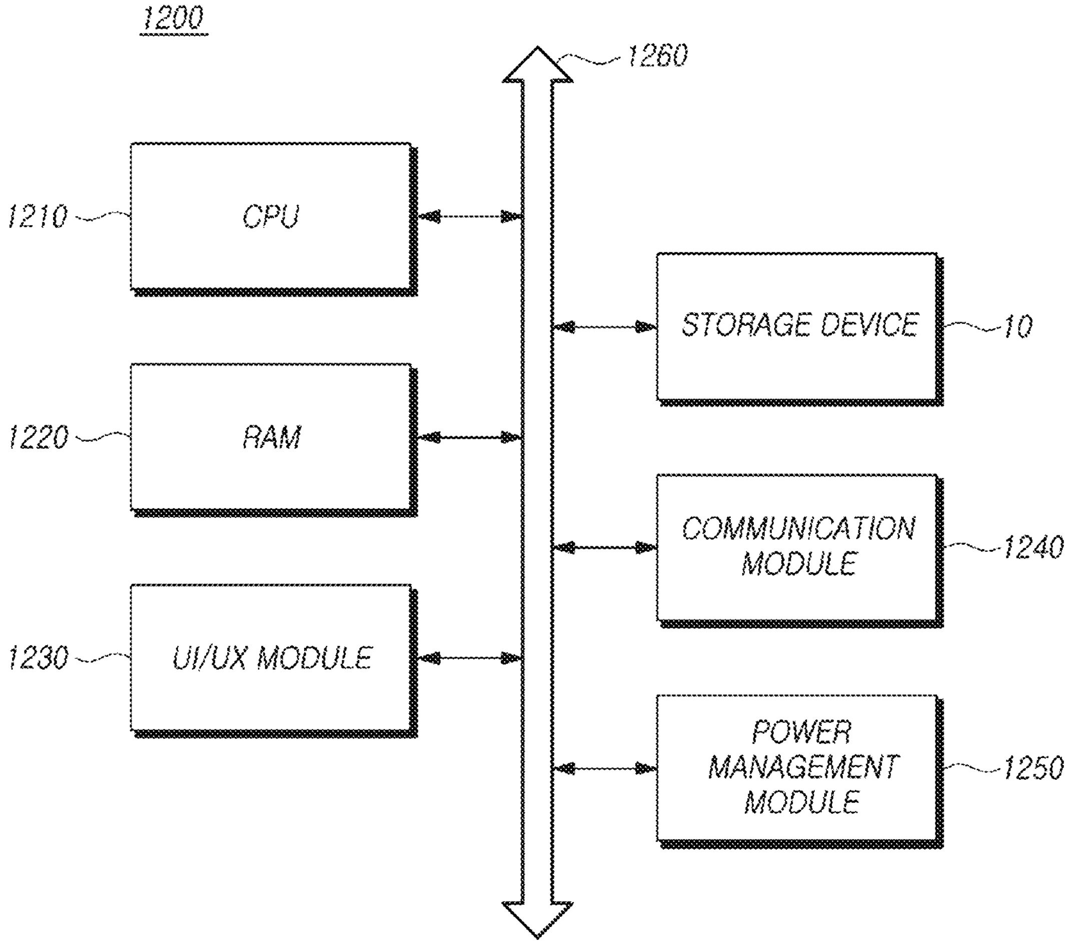
FIG. 12 illustrates the configuration of a computing system based on some embodiments of the disclosed technology.

FIG. 12 is a diagram illustrating the configuration of a computing system 1200 based on an embodiment of the disclosed technology.

Referring to FIG. 12, the computing system 1200 based on an embodiment of the disclosed technology may include: a storage device 10 electrically connected to a system bus 1260; a CPU 1210 configured to control the overall operation of the computing system 1200; a RAM 1220 configured to store data and information related to operations of the computing system 1200; a user interface/user experience (UI/UX) module 1230 configured to provide the user with a user environment; a communication module 1240 configured to communicate with an external device as a wired and/or wireless type; and a power management module 1250 configured to manage power used by the computing system 1200.

The computing system 1200 may be a personal computer (PC) or may include a mobile terminal such as a smartphone, a tablet or various electronic devices.

The computing system 1200 may further include a battery for supplying an operating voltage, and may further include an application chipset, a graphic-related module, a camera image processor, and a DRAM. Other elements would be apparent to a person skilled in the art.

The storage device 10 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Based on embodiments of the disclosed technology described above, the operation delay time of the memory system may be advantageously reduced or minimized. In addition, based on an embodiment of the disclosed technology, an overhead occurring in the process of calling a specific function may be advantageously reduced or minimized. Although various embodiments of the disclosed technology have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims. Furthermore, the embodiments may be combined to form additional embodiments.

What is claimed is:

1. A storage device comprising:

a plurality of memory package chips each including a plurality of memory dies capable of storing data;

a controller configured to communicate with the plurality of memory package chips and connected to the plurality of memory package chips through one or more daisy chain circuits; and an input capacitor directly connected between a point and a ground, the point being connected to a first daisy chain circuit of the one or more daisy chain circuits, wherein the input capacitor reduces ringback in the first daisy chain circuit, and wherein the controller is coupled to the point.

2. The storage device of claim 1, wherein each of the plurality of memory package chips further includes an interface chip connected to the plurality of memory dies and configured to provide an interface for the controller to access the plurality of memory dies.

3. The storage device of claim 2, wherein the memory dies included in one of the memory package chips are divided into a first memory die group and a second memory die group, wherein the memory dies included in the first memory die group are connected to the interface chip through a first channel, and wherein the memory dies included in the second memory die group are connected to the interface chip through a second channel.

4. The storage device of claim 1, further comprising a termination resistor connected to one or more of the daisy chain circuits.

5. The storage device of claim 4, wherein a structure in which the termination resistor is connected to the one or more daisy chain circuits is determined according to a terminal of the controller to which the one or more daisy chain circuits are connected.

6. The storage device of claim 5, wherein the termination resistor is connected between a termination voltage input terminal and one of the one or more daisy chain circuits.

7. The storage device of claim 6, wherein the daisy chain circuit connected to the termination resistor is connected to a data input/output signal terminal of the controller.

8. The storage device of claim 5, wherein the termination resistor is connected between a first daisy chain circuit and a second daisy chain circuit of the one or more daisy chain circuits.

9. The storage device of claim 8, wherein the first daisy chain circuit and the second daisy chain circuit are connected to respective data strobe signal terminals of the controller.

10. The storage device of claim 5, wherein the termination resistor is connected to a termination voltage input terminal, a first daisy chain circuit, and a second daisy chain circuit of the one or more daisy chain circuits.

11. The storage device of claim 10, wherein the first daisy chain circuit and the second daisy chain circuit are connected to respective read enable signal terminals of the controller.

12. The storage device of claim 1, wherein the input capacitor is connected between 1) the point between the controller and another point where a conductive line branches from the first daisy chain circuit to a memory package chip closest to the controller among the plurality of memory package chips, and 2) the ground.

13. The storage device of claim 1, wherein the first daisy chain circuit is connected to an address latch enable signal terminal, a command latch enable signal terminal, a write enable signal terminal, or a chip enable signal terminal of the controller.

* * * * *